United States Patent
Miura et al.

(10) Patent No.: US 7,763,892 B2
(45) Date of Patent: Jul. 27, 2010

(54) GROUP III NITRIDE SEMICONDUCTOR DEVICE AND EPITAXIAL SUBSTRATE

(75) Inventors: Kouhei Miura, Osaka (JP); Makoto Kiyama, Itami (JP); Takashi Sakurada, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 17 days.

(21) Appl. No.: 11/571,990

(22) PCT Filed: Jan. 20, 2006

(86) PCT No.: PCT/JP2006/300822
§ 371 (c)(1),
(2), (4) Date: Jan. 12, 2007

(87) PCT Pub. No.: WO2006/117902
PCT Pub. Date: Nov. 9, 2006

(65) Prior Publication Data
US 2008/0315209 A1  Dec. 25, 2008

(30) Foreign Application Priority Data
Apr. 26, 2005 (JP) .................... 2005-128470

(51) Int. Cl.
*H01L 29/12* (2006.01)
*H01L 21/36* (2006.01)
(52) U.S. Cl. .................. 257/76; 257/613; 438/478
(58) Field of Classification Search ............... 257/76
See application file for complete search history.

(56) References Cited
U.S. PATENT DOCUMENTS
6,316,785 B1*  11/2001  Nunoue et al. ............... 257/14

6,806,508 B2  10/2004  D'Evelyn et al.
2002/0093055 A1*  7/2002  Shibata et al. ............... 257/352
2003/0045035 A1  3/2003  Shenai et al.

FOREIGN PATENT DOCUMENTS

| CN | 1462060 A | 12/2003 |
|---|---|---|
| JP | 2002-252177 A | 9/2002 |
| JP | 2003-012398 A | 1/2003 |

(Continued)

OTHER PUBLICATIONS

Joon Seop Kwak et al, Crystal-Polarity dependence of Ti/Al contacts to freestanding n-GaN substrate, Nov. 12, 2001, Applied Physics Letters, vol. 79, No. 20 (pp. 3254-3256).*

(Continued)

*Primary Examiner*—Bradley K Smith
*Assistant Examiner*—Mohammad Choudhry
(74) *Attorney, Agent, or Firm*—James W. Judge

(57) ABSTRACT

Affords a Group III nitride semiconductor device having a structure that can improve the breakdown voltage. A Schottky diode (11) consists of a Group III nitride support substrate (13), a gallium nitride region (15), and a Schottky electrode (17). The Group III nitride support substrate (13) has electrical conductivity. The Schottky electrode (17) forms a Schottky junction on the gallium nitride region (15). The gallium nitride region (15) is fabricated on a principal face (13a) of the Group III nitride support substrate (13). The gallium nitride region (15) has a $(10\bar{1}2)$-plane XRD full-width-at-half-maximum of 100 sec or less.

1 Claim, 8 Drawing Sheets

FOREIGN PATENT DOCUMENTS

| | | |
|---|---|---|
| JP | 2003-045899 A | 2/2003 |
| JP | 2003-243302 A | 8/2003 |
| JP | 2003-282863 A | 10/2003 |
| JP | 2003-327497 A | 11/2003 |
| WO | WO-03-094240 A1 | 11/2003 |

OTHER PUBLICATIONS

J.W. Johnson et al, Schottky Rectifiers fabricated on free-standing GaN substrate, Jan. 16, 2001, Solid State Electronics 45 (2001) 405-410.*

Joon Seop Kwak et al., "Crystal-Polarity Dependence of Ti/Al Contacts to Freestanding n-GaN Substrate," Applied Physics Letters, Nov. 12, 2001, pp. 3254-3256, vol. 79, No. 20, American Institute of Physics, NY.

J.W. Johnson et al., "Schottky Rectifiers Fabricated on Free-Standing GaN Substrates," Solid-State Electronics, Mar. 1, 2001, pp. 405-410, vol. 45, No. 3, Elsevier Science Publishers, GB.

Y. Irokawa et al., "Si+ Ion Implanted MPS Bulk GaN Diodes," Solid-State Electronics, May 1, 2004, pp. 827-830, vol. 48, No. 5, Elsevier Science Publishers, GB.

Seung-Chui Lee et al., "A New Vertical GaN Schottky Barrier Diode with Floating Metal Ring for High Breakdown Voltage," Proceedings of 2004 International Symposium on Power Semiconductor Devices and Ics. Kitakyushu, May 24-27, 2004, pp. 319-322, Japan.

A.P. Zhang et al., "Vertical and Lateral GaN Rectifiers on Free-Standing GaN Substrates," Applied Physics Letters, Sep. 3, 2001, pp. 1555-1557, vol. 79, No. 10, American Institute of Physics, NY.

K. IP et al., "High Current Bulk GaN Schottky Rectifiers," Solid-State Electronics, Dec. 1, 2002, pp. 2169-2172, vol. 46, No. 12, Elsevier Science Publishers, GB.

Gerard T. Dang, et al., "High Voltage GaN Schottky Rectifiers," IEEE Transcations on Electron Devices, Apr. 2000, pp. 692-696, vol. 47, No. 4, IEEE, N. Y.

* cited by examiner

GROUP III NITRIDE SEMICONDUCTOR DEVICE AND EPITAXIAL SUBSTRATE

TECHNICAL FIELD

The present invention relates to Group III nitride semiconductor devices and epitaxial substrates.

BACKGROUND ART

A Schottky diode that is fabricated on a sapphire substrate is discussed in Non-Patent Document 1. Two kinds of GaN are grown onto a sapphire substrate having a c-plane. First, an n⁺ contact layer having a thickness of 1 μm is fabricated onto a low-temperature buffer layer. Then, an undoped GaN layer is grown onto the n⁺ contact layer. After forming a mesa structure, a Ti/Al ohmic electrode and a Pt/Au electrode are fabricated.

Non-Patent Document 1: Gerard T Dang et al. "High Voltage GaN Schottky Rectifiers," IEEE Tran. Electron Devices, Vol. 47, No. 4, pp. 692-696.

DISCLOSURE OF INVENTION

Problems Invention is to Solve

According to experiments by the inventors, sufficient breakdown voltage is not obtained with Schottky diodes fabricated on sapphire substrates. As a result of the inventors having investigated the reason for this, it became apparent that leakage current from the Schottky electrode is relevant, and that the leakage current is related to the threading dislocation density of the gallium nitride layer. What is being sought is improvement of the breakdown voltage of the Schottky diodes.

An object of the present invention, brought about taking the above-described circumstances into consideration, is to make available Schottky diodes having structures to improve the breakdown voltage, and meanwhile an object is to make available epitaxial substrates for semiconductor devices that include Schottky electrodes.

Means for Resolving the Problem

One aspect of the present invention involves a Group III nitride semiconductor device that has a Schottky junction. The Group III nitride semiconductor device is furnished with: (a) a Group III nitride support substrate having electrical conductivity; (b) a gallium nitride region provided on the principal face of the Group III nitride support substrate and having a (10$\bar{1}$2)-plane XRD full-width-at-half-maximum of 100 sec or less; and (c) a Schottky electrode constituting the Schottky junction on the gallium nitride region.

As given by this Group III nitride semiconductor device, since the Schottky electrode forms the Schottky junction on gallium nitride region having a (10$\bar{1}$2)-plane XRD full-width-at-half-maximum of 100 sec or less, reverse leakage current involving the Schottky junction is reduced.

In a Group III nitride semiconductor device involving the present invention, it is preferable that the Group III nitride support substrate be composed of gallium nitride having electrical conductivity.

In a Group III nitride semiconductor device according to the present invention, current flowing through the Schottky junction is $1\times10^{-7}$ A/cm² or less when a reverse bias of 5 volts is applied across the Schottky electrode and the back side of the Group III nitride support substrate.

According to a separate aspect of the present invention, an epitaxial substrate is furnished with: (a) a Group III nitride substrate having electrical conductivity; and (b) a gallium nitride layer having a (10$\bar{1}$2)-plane XRD full-width-at-half-maximum of 100 sec or less and provided on the Group III nitride substrate.

As given by this epitaxial substrate, that fact that the (10$\bar{1}$2)-plane XRD full-width-at-half-maximum of the gallium nitride layer is 100 sec or less makes it possible to form Schottky junctions that can reduce leakage current.

In an epitaxial substrate involving the present invention, it is preferable that the Group III nitride substrate is composed of gallium nitride having electrical conductivity. Furthermore, in the epitaxial substrate according to the present invention it is preferable that the threading dislocation density of the Group III nitride substrate is not more than $1\times10^8$ cm⁻².

From the following detailed description of select embodiments of the present invention, proceeding with reference to the accompanying drawings, the above-described objects and other objects, features, and advantages of the present invention will become readily apparent.

Advantageous Effects of the Invention

As described above, according to the present invention, a Schottky diode having a structure that can improve the breakdown voltage is afforded. Furthermore, according to the present invention, an epitaxial substrate for a semiconductor device including a Schottky electrode is afforded.

BRIEF DESCRIPTION OF DRAWINGS

FIG. 2 B is a view representing the structure of a Schottky diode utilizing a sapphire substrate.

FIG. 6 B is a view representing the manufacture of an epitaxial substrate involving the second embodiment.

FIG. 6 C is a view representing the manufacture of an epitaxial substrate involving the second embodiment.

LEGEND

11: Schottky diode; 13: Group III nitride support substrate; 15: gallium nitride region; 17: Schottky electrode; 31: n-type gallium nitride wafer; 33: gallium nitride layer; 35: Schottky electrode; 37: ohmic electrode; 41: sapphire substrate; 43: seeding layer; 45: n⁺ gallium nitride layer; 47: n⁺ gallium nitride layer; 49: Schottky electrode; 51: ohmic electrode; 81: epitaxial substrate; 83: gallium nitride freestanding substrate; 85: GaN epitaxial film; 87: Schottky electrode; 89: ohmic electrode; 82: gallium nitride freestanding substrate; 82c: high dislocation regions; 82d: low dislocation regions; 84: gallium nitride freestanding substrate; 84c: high dislocation regions; 84d: low dislocation regions.

BEST MODE FOR CARRYING OUT THE INVENTION

Insights into the present invention will be readily understood by considering the detailed description below with reference to accompanying figures presented as examples. Next, referring to the accompanying figures, a description will be made of embodiments concerning a Group III nitride semiconductor device and an epitaxial substrate according to the present invention. In the following explanation, a Schottky diode will be used as one example of Group III nitride semiconductor devices. Note that where possible identical components are labeled with the same reference marks.

Embodiment Mode 1

Figure 1:
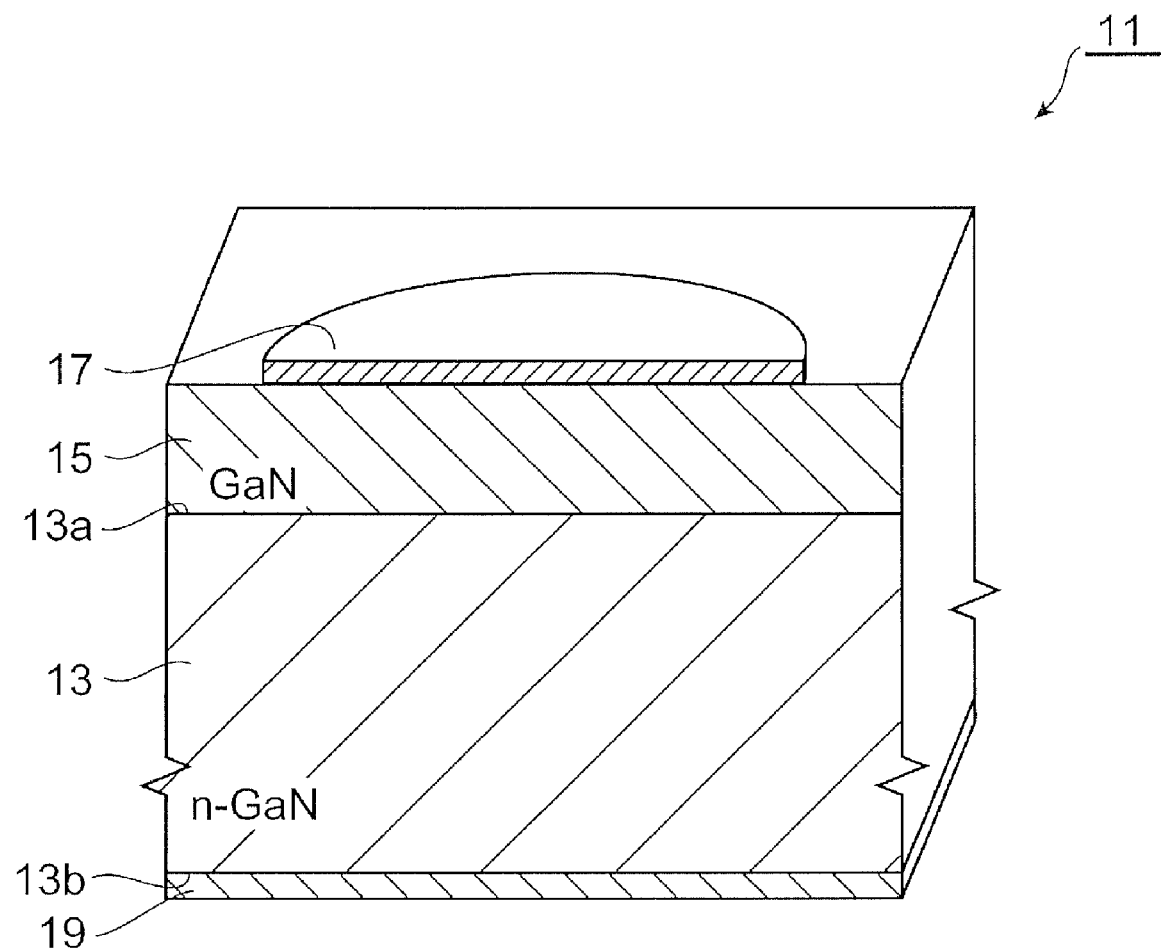
FIG. 1 is a view depicting a Schottky diode involving a first embodiment.

FIG. 1 is a view of a Schottky diode according to a first embodiment mode of the present invention. The Schottky diode 11 consists of a Group III nitride support substrate 13, a gallium nitride region 15, and a Schottky electrode 17. The Group III nitride support substrate 13 possesses electrical conductivity. The Schottky electrode 17 constitutes a Schottky junction on the gallium nitride region 15. The gallium nitride region 15 is fabricated on a principal face 13a of the Group III nitride support substrate 13. The gallium nitride region 15 has (10$\bar{1}$2)-plane XRD full-width-at-half-maximum of 100 sec or less.

The Schottky diode 11 includes an ohmic electrode 19 fabricated on a back side 13b of the Group III nitride support substrate 13. The Schottky electrode 17 may be composed of a Ni/Au electrode, for example. The ohmic electrode 19 may be composed of a Ti/Al/Ti/Au electrode.

The Group III nitride support substrate 13 is composed of gallium nitride, aluminum nitride, or the like. Preferably, the Group III nitride support substrate 13 is composed of n-type gallium nitride having electrical conductivity. In this example, the gallium nitride region is homo-epitaxially grown on the gallium nitride support substrate. The gallium nitride support substrate has a carrier concentration of $1\times10^{16}$ cm$^{-3}$ to $1\times10^{19}$ cm$^{-3}$ inclusive. The gallium nitride region 15 has a thickness of 0.1 μm to 1000 μm inclusive. The gallium nitride region 15 has a carrier concentration of $1\times10^{17}$ cm$^{-3}$ or less.

Figure 2A:
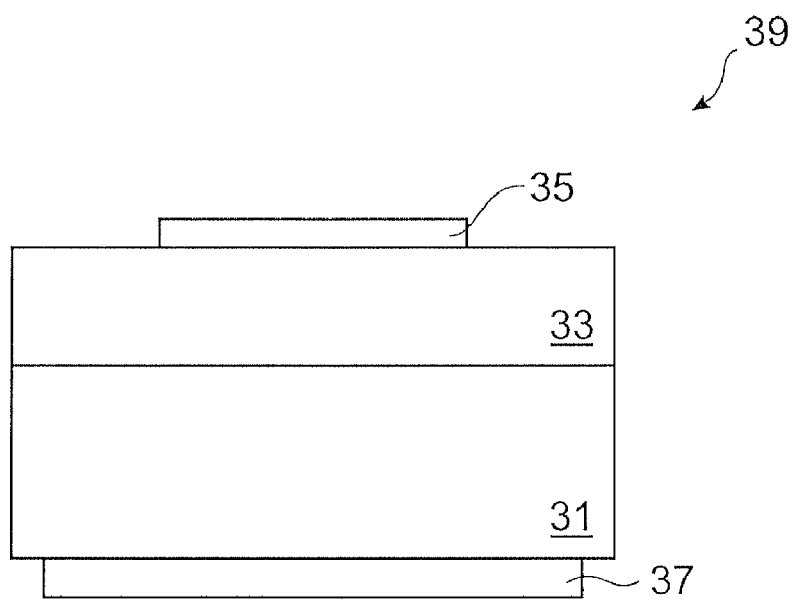
FIG. 2 A is a view representing the structure of a Schottky diode utilizing a gallium nitride substrate.
Figure 2B:
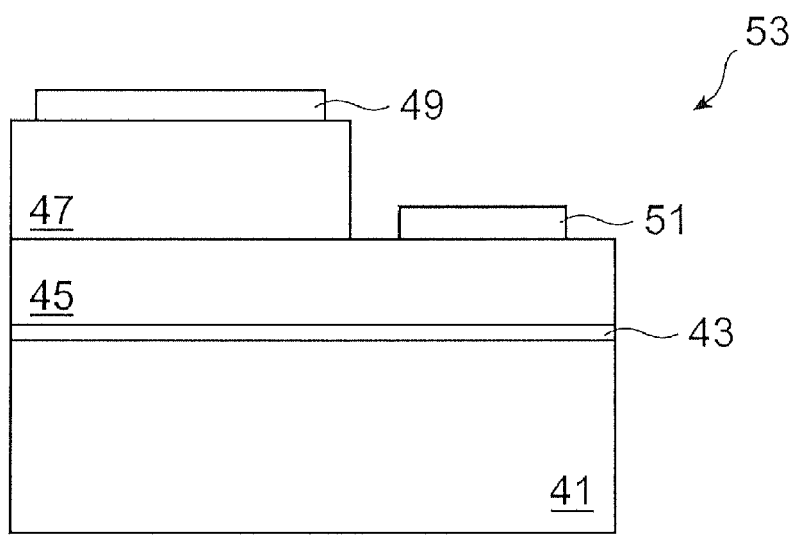

A description will be made on the manufacturing of the Schottky diode shown in FIG. 2A and FIG. 2B.

Embodiment Example 1

An n-type gallium nitride wafer 31 is placed in a reactor of an MOVPE device. A gas atmosphere including hydrogen, nitrogen, and ammonia is produced in the reactor. In this atmosphere, the gallium nitride wafer 31 undergoes a heat treatment at 1000 degrees C. The heat treatment time is twenty minutes, for example. Ammonia and trimethylgallium (TMG) are supplied to the reactor, and a gallium nitride layer 33 having a thickness of 3 μm is grown at 1130 degrees C. By these processes, an epitaxial substrate including the gallium nitride wafer 31 and the gallium nitride layer 33 is manufactured. On a front side of the gallium nitride layer of this epitaxial substrate is fabricated a Schottky electrode 35 composed of Ni/Au, and on a back side of the epitaxial substrate is fabricated an ohmic electrode 37 composed of Ti/Al/Ti/Au. The Schottky electrode has a radius of 50 μm, for example. By these processes, a Schottky diode (SBD) 39 as shown in FIG. 2A is obtained.

Experiment 1

A sapphire substrate 41 is placed in a reactor of an MOVPE device. A gas atmosphere including hydrogen, nitrogen, and ammonia is produced in the reactor. In this atmosphere, the sapphire substrate 41 undergoes a heat treatment at 1170 degrees C. The heat treatment time is ten minutes, for example. A seeding layer 43 is grown on the sapphire substrate 41. Ammonia, trimethylgallium (TMG) and silane are provided to the reactor, and an n⁺ gallium nitride layer 45 is grown at 1130 degrees C. Next, like the Example, ammonia and trimethylgallium (TMG) are supplied to the reactor, and a gallium nitride layer having a thickness of 3 μm is grown at 1130 degrees C. A part of the gallium nitride layer is etched to form a mesa including a gallium nitride layer 47, and a part of the n⁺ gallium nitride layer 45 is exposed. The etching is performed by a selective reactive ion etching (RIE) method. On a front side of the mesa is fabricated a Schottky electrode 49 composed of Ni/Au, and on a front side of the exposed n⁺ gallium nitride layer 47 is fabricated an ohmic electrode 51 composed of Ti/Al/Ti/Au. By these processes, the Schottky diode (SBD) 53 as shown in FIG. 2B is obtained.

Figure 3:
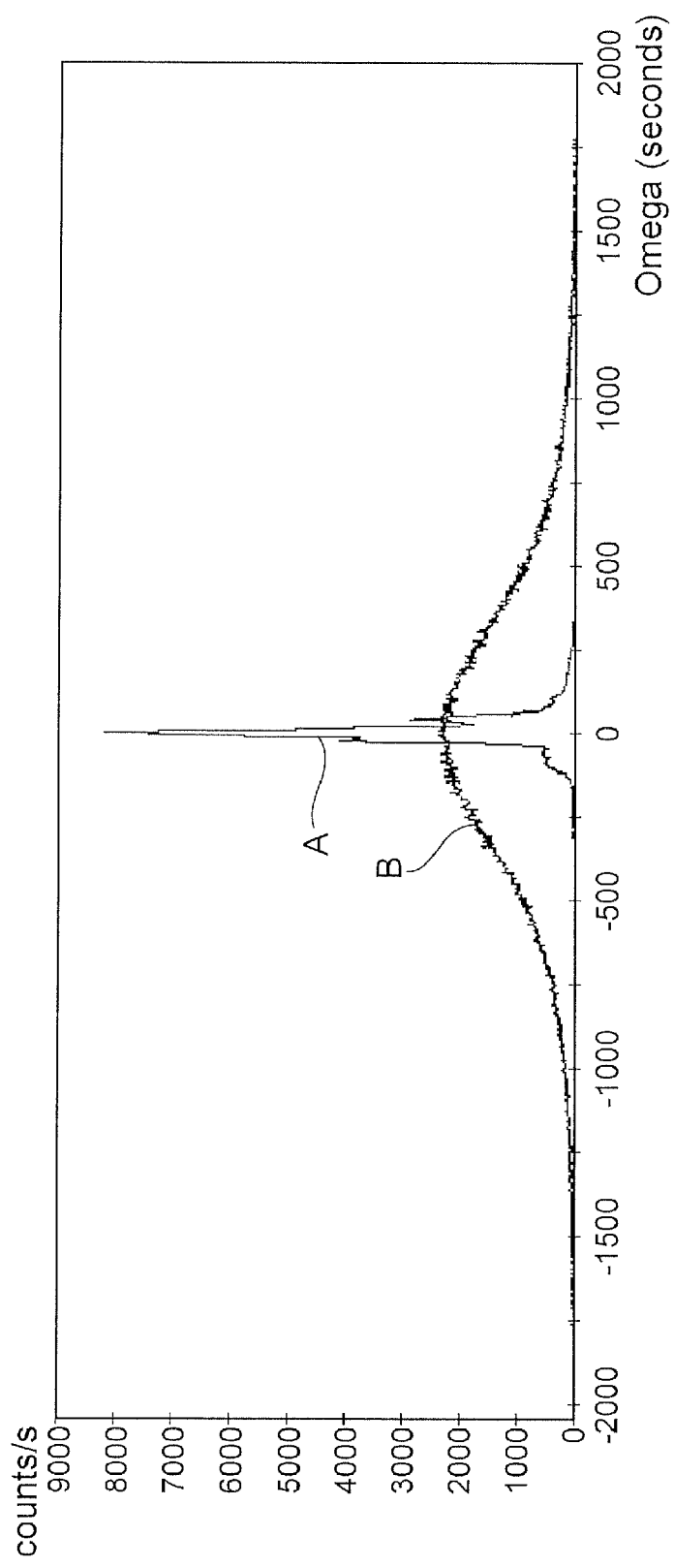
FIG. 3 is a graph plotting the (10$\bar{1}$2)-plane XRD characteristics of gallium nitride layers fabricated by the above-described embodiment example (characteristic A) and experiment (characteristic B).

FIG. 3 is a view of (10$\bar{1}$2)-plane XRD characteristics of the gallium nitride layers that are manufactured by the above Example (characteristic A) Experiment (characteristic B). In these examples, the full-width-at-half-maximum (FWHM) of the characteristic A is 25.1 sec, and the full-width-at-half-maximum of the characteristic B is 788.0 sec.

Figure 4:
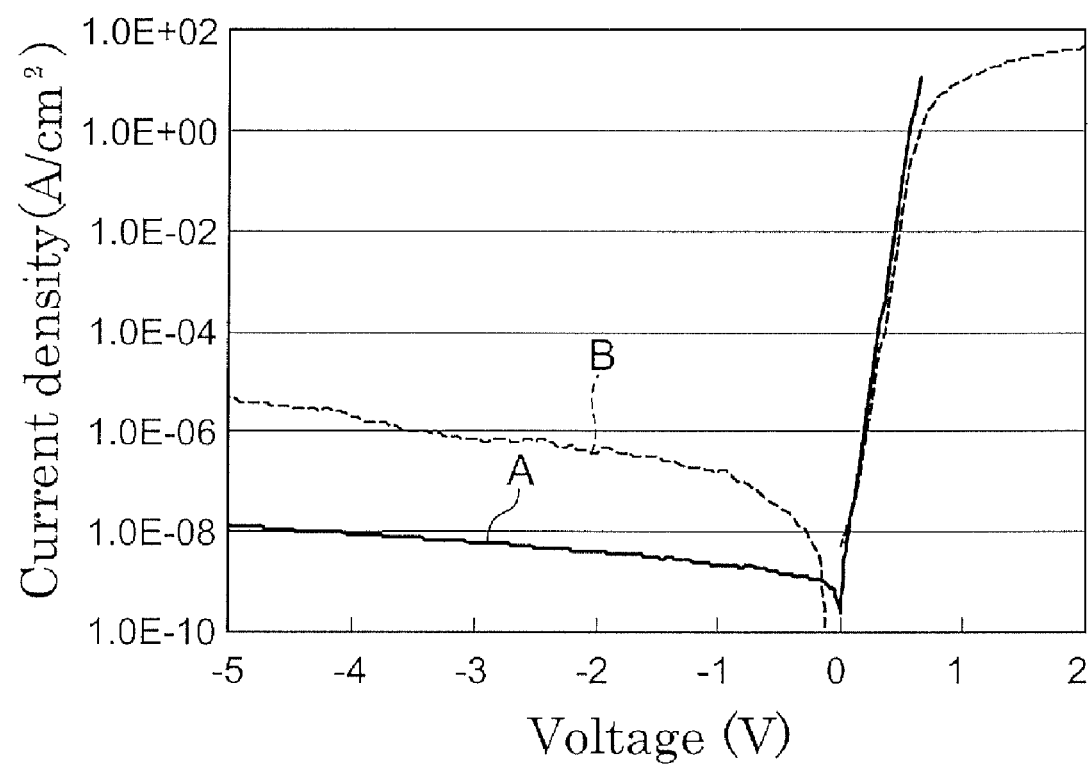
FIG. 4 is a graph plotting current-voltage characteristics of Schottky diodes fabricated by the above-described embodiment example (characteristic A) and experiment (characteristic B).

FIG. 4 is a view of the current-voltage characteristics of the Schottky diodes that are manufactured by the above Embodiment Example (characteristic A) and Experiment (characteristic B). In these examples, the reverse leakage current density (applied voltage 5 volts) of the characteristic A is $1.39\times10^{-8}$ A/cm², and the reverse leakage current density (applied voltage 5 volts) of the characteristic B is $4.76\times10^{-6}$ A/cm².

As shown above, the SBD 39 has a lower leakage current compared to the SBD 53. Presumably, the reason is that the threading dislocation density of the gallium nitride layer 33 is reduced as shown by acute FWHM of XRD.

Figure 5:
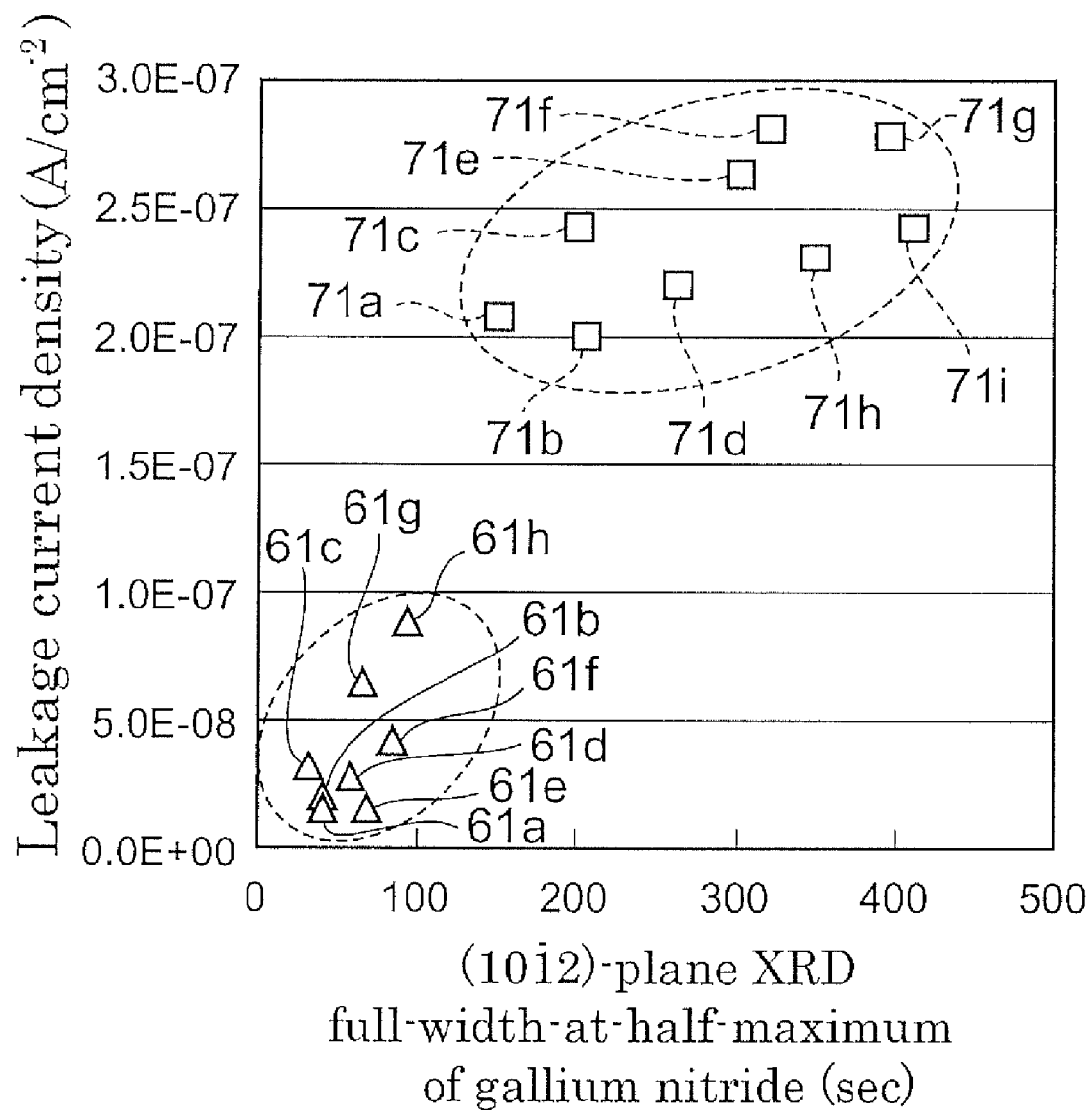
FIG. 5 is a chart diagramming the relationship between the full-width-at-half-maximum (10$\bar{1}$2)-plane XRD characteristic and the leakage current density of the gallium nitride layers.

FIG. 5 is a view of relationships between the full-width-at-half-maximum of (10$\bar{1}$2)-plane XRD characteristic of the gallium nitride layers and the leakage current density. Symbols indicated by reference numbers 61a through 61h represent values that are obtained by measuring a structure in which the Schottky electrode is fabricated on the gallium nitride layer formed utilizing the gallium nitride substrate. Symbols indicated by reference numbers 71a through 71i represent values that are gained by measuring a structure in the Schottky electrode is fabricated on the gallium nitride layer formed utilizing the sapphire substrate.

Embodiment Example 2

To present specific examples:
Schottky diode structure for reference tally 61a—
Full-width-at-half-maximum: 41.8 sec,
Leakage current: $1.31\times10^{-8}$ A/cm²;

Schottky diode structure for reference tally 61b—
Full-width-at-half-maximum: 41.8 sec,
Leakage current: $1.86 \times 10^{-8}$ A/cm$^2$;
Schottky diode structure for reference tally 61c—
Full-width-at-half-maximum: 33 sec and a Leakage current: $3.00 \times 10^{-8}$ A/cm$^2$.
Schottky diode structure for reference tally 61d—
Full-width-at-half-maximum: 60 sec,
Leakage current: $2.70 \times 10^{-8}$ A/cm$^2$;
Schottky diode structure for reference tally 61e—
Full-width-at-half-maximum: 72 sec,
Leakage current: $1.40 \times 10^{-8}$ A/cm$^2$;
Schottky diode structure for reference tally 61f—
Full-width-at-half-maximum: 87 sec,
Leakage current: $4.10 \times 10^{-8}$ A/cm$^2$;
Schottky diode structure for reference tally 61g—
Full-width-at-half-maximum: 69 sec,
Leakage current: $6.30 \times 10^{-8}$ A/cm$^2$;
Schottky diode structure for reference tally 61h—
Full-width-at-half-maximum: 95 sec,
Leakage current: $8.70 \times 10^{-8}$ A/cm$^2$.

Experiment 2

To present specific examples:
Schottky diode structure for reference tally 71a (with the smallest full-width-at-half-maximum)—
Full-width-at-half-maximum: 152 sec,
Leakage current: $2.07 \times 10^{-7}$ A/cm$^2$;
Schottky diode structure for reference tally 71b (with the smallest leakage current)—
Full-width-at-half-maximum: 206 sec,
Leakage current: f $1.98 \times 10^{-7}$ A/cm$^2$.

Next, advantages will be described of using $(10\bar{1}2)$-plane XRD of the gallium nitride region as a crystal quality indicator. It was reported that at an interface between the electrode and the gallium nitride where the threading dislocation exists, Schottky barrier is low and the leakage current of the Schottky electrode is increased (Yu Huang et al., "Experimental study and modeling of the influence of threading dislocations on the performance of Au/n-GaN Schottky diodes," J. Appl. Phys., Vol. 94, No. 9, pp. 5771-5775). Because the $(10\bar{1}2)$-plane XRD full-width-at-half-maximum of the gallium nitride region becomes wider if either threading dislocations or edge dislocations exist, the fact that $(10\bar{1}2)$-plane XRD full-width-at-half-maximum is acute means that both of the screw and edge dislocations are reduced. In principle, it is possible to use planes other than $(10\bar{1}2)$ plane as an indicator, but $(10\bar{1}2)$-plane XRD is suitable for the indicator because it has enough strength. The forward current of the Schottky diode is about 0.1 A/cm$^{-2}$, and it is necessary to set the leakage current to be not more than $1 \times 10^{-7}$ A/cm$^2$, not more than one millionth of the forward current. As shown in FIG. 5, as $(10\bar{1}2)$-plane XRD full-width-at-half-maximum of the gallium nitride region is set to be 100 sec or less, the leakage current can be set to not more than $1 \times 10^{-7}$ A/cm$^2$. Utilizing Group III nitride for a substrate facilitates obtaining a gallium nitride region whose $(10\bar{1}2)$-plane XRD full-width-at-half-maximum is not more than 100 sec.

Embodiment Mode 2

Figure 6A:
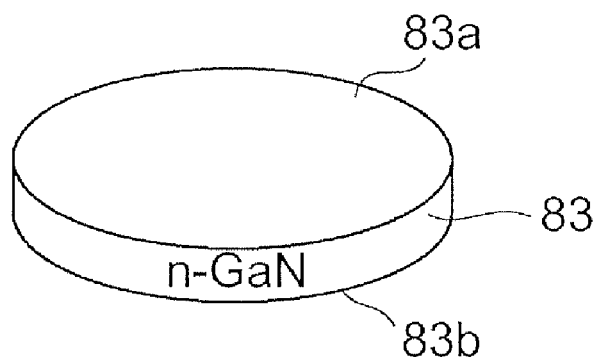
FIG. 6 A is a view representing the manufacture of an epitaxial substrate involving a second embodiment.
Figure 6B:
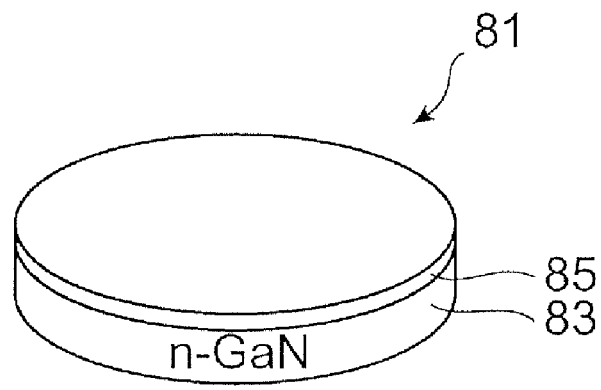
Figure 6C:
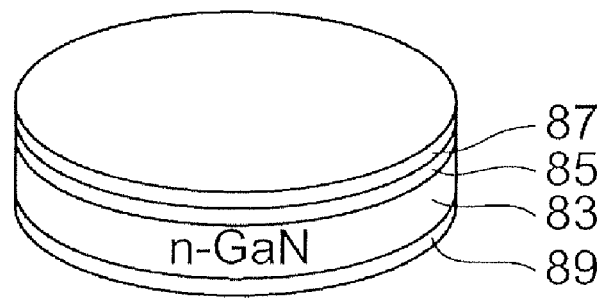

FIG. 6A through FIG. 6C are views representing the manufacture of an epitaxial substrate according to the second embodiment mode. As shown in FIG. 6A, a gallium nitride freestanding substrate 83 having n$^-$conductivity is prepared. The gallium nitride freestanding substrate 83 has a carrier concentration of over $1 \times 10^{17}$ cm$^{-3}$. As shown in FIG. 6B, an undoped GaN epitaxial film 85 is deposited on a first surface 83a of the gallium nitride freestanding substrate 83. The gallium nitride epitaxial film 85 has a thickness between 0.1 µm and 1000 µm inclusive. The carrier concentration of the gallium nitride epitaxial film 85 is $1 \times 10^{17}$ cm$^{-3}$ or less. This provides an epitaxial substrate 81. By utilizing this substrate, the Schottky diode shown in the first embodiment can be manufactured. As shown in FIG. 6C, on a front side of the epitaxial film 85 of the epitaxial substrate 81 is deposited a Schottky electrode film 87, and on a second surface 83b of the substrate 83 is deposited an ohmic electrode film 89. The Schottky electrode and the ohmic electrode are fabricated of the Schottky electrode film 87 and the ohmic electrode film 89, respectively. Because $(10\bar{1}2)$-plane XRD full-width-at-half-maximum of the gallium nitride region is used as a crystal quality indicator to monitor the quality of the gallium nitride film in which the Schottky electrode constitutes a Schottky junction, an epitaxial substrate can be afforded for a semiconductor device in which the reverse leakage current, flowing through the Schottky junction when a voltage is applied across the Schottky electrode and the ohmic electrode, can be reduced.

In this epitaxial substrate, the gallium nitride layer is fabricated on the Group III nitride substrate such as a GaN substrate, and has $(10\bar{1}2)$-plane XRD full-width-at-half-maximum of 100 sec or less. According to this epitaxial substrate, since the $(10\bar{1}2)$-plane XRD full-width-at-half-maximum of the gallium nitride layer is not more than 100 sec, a Schottky junction is fabricated that can reduce leakage current. This epitaxial substrate is suitable for manufacturing Schottky diodes.

Figure 7:
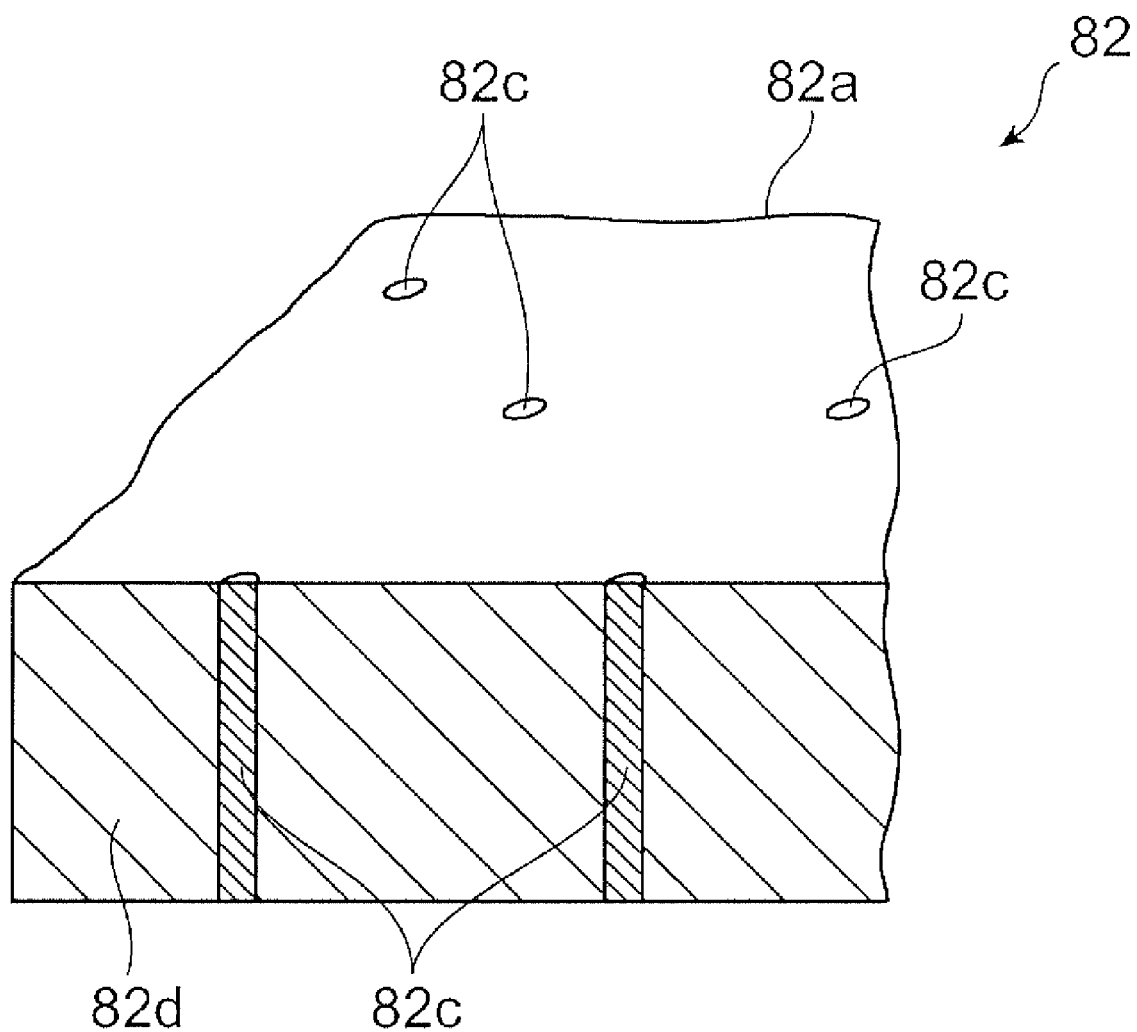
FIG. 7 is a view representing one arrangement of high dislocation regions and low dislocation regions in a GaN freestanding substrate.

FIG. 7 is a view of one example location of high dislocation regions and low dislocation regions in a gallium nitride freestanding substrate for the first and second embodiments. A first surface 82a of the gallium nitride freestanding substrate 82 for the epitaxial substrate 81 has first areas where high dislocation regions 82c having relatively high threading dislocation density appear and second areas where low dislocation regions 82d having a relatively low threading dislocation density appear. The high dislocation regions 82c are surrounded by the low dislocation regions 82d and the first areas are distributed in a dot-like pattern at random in the second area, in the first surface 82a. The threading dislocation density as a whole is not more than $1 \times 10^8$ cm$^{-2}$, for example. In the epitaxial substrate 81, since the dislocation density is low, the dislocation in the epitaxial layer is reduced. Accordingly, the reverse leakage current is decreased and the reverse breakdown voltage is improved.

Figure 8:
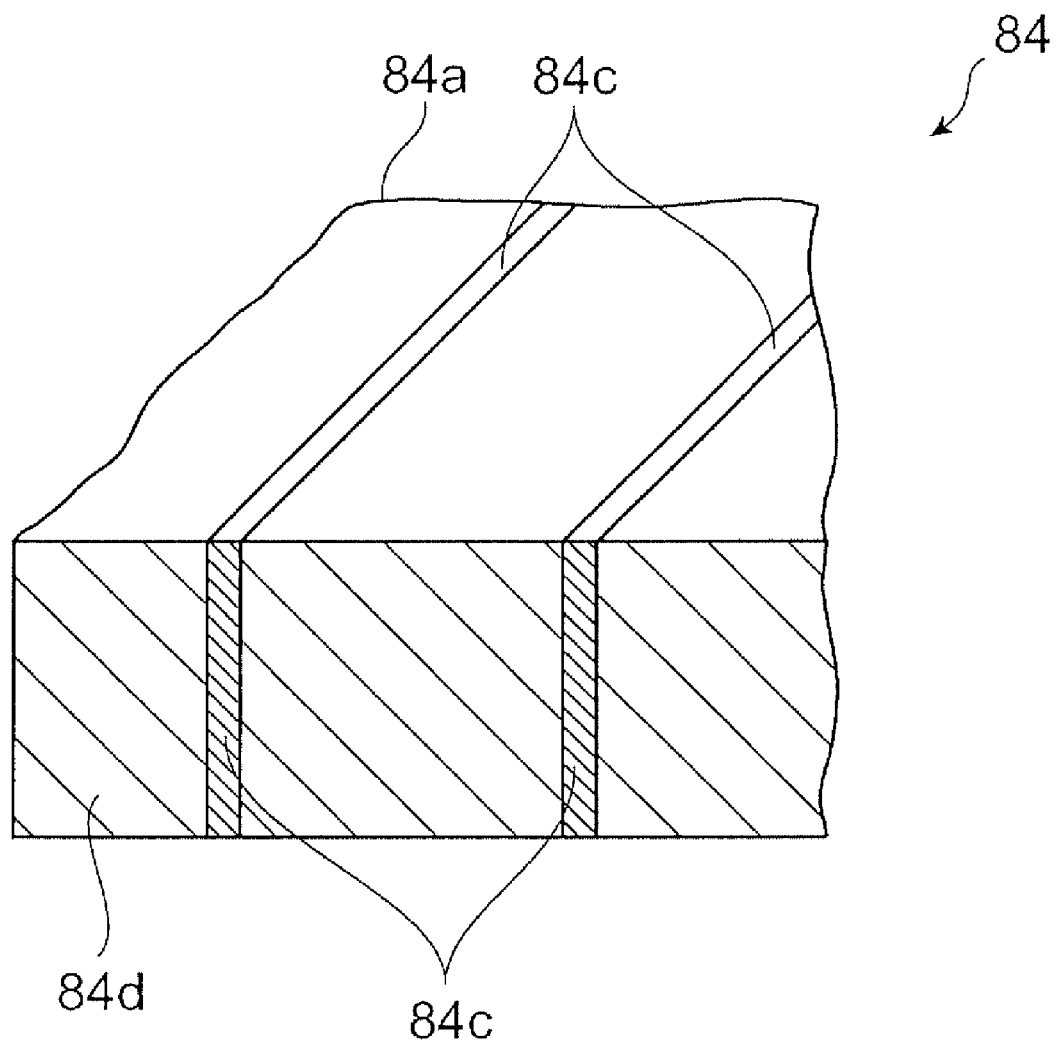
FIG. 8 is a view representing another arrangement of high dislocation regions and low dislocation regions in a GaN freestanding substrate.

FIG. 8 is a view of another example location of high dislocation regions and low dislocation regions in a gallium nitride freestanding substrate for the first and second embodiments. A first surface 84a of a gallium nitride freestanding substrate 84 for the epitaxial substrate 81 has first areas where high dislocation regions 84c having a relatively high threading dislocation density appear and second areas where low dislocation regions 84d having a relatively low threading dislocation density appear. The high dislocation regions 84c are sandwiched between the high dislocation regions 84d, and are distributed in the second areas regularly in a striped pattern, in the first surface 84a. The threading dislocation density as a whole is $1 \times 10^8$ cm$^{-2}$ or less, for example. In this epitaxial substrate 81, since the dislocation density is low, the dislocation in the epitaxial layer is decreased. Accordingly, the reverse leakage current density is decreased and the reverse breakdown voltage is improved.

The principles of the present invention have been illustrated in select modes of embodiment, yet that the present invention can be altered in terms of arrangement and particulars without departing from those principles will be recognized by persons skilled in the art. The present invention is not limited to the specific configurations disclosed in the present modes of embodiment. Accordingly, the rights in the scope of the patent claims, and in all modifications and changes deriving from the scope of the spirit thereof are claimed.

The invention claimed is:

1. A gallium nitride semiconductor device having a Schottky junction, the gallium nitride semiconductor device comprising:

a gallium nitride support substrate having electrical conductivity;

a gallium nitride region provided on the principal face of said gallium nitride support substrate and having a (10$\overline{1}$2)-plane XRD full-width-at-half-maximum of 100 sec or less;

a Schottky electrode constituting the Schottky junction on said gallium nitride region; and an ohmic electrode formed on the back side of said gallium nitride support substrate; wherein the current density at said Schottky junction is $1 \times 10^{-7}$ A/cm$^2$ or less when a reverse bias of 5 volts is applied across said Schottky electrode and the back side of said gallium nitride support substrate.

\* \* \* \* \*